United States Patent [19]

Watanabe

[11] Patent Number: 5,264,382

[45] Date of Patent: Nov. 23, 1993

[54] METHOD OF PRODUCING SEMICONDUCTOR DEVICE USING DUMMY GATE STRUCTURE

[75] Inventor: Yuu Watanabe, Hadano, Japan

[73] Assignee: Fujitsu Limited, Tokyo, Japan

[21] Appl. No.: 670,805

[22] Filed: Mar. 18, 1991

[30] Foreign Application Priority Data

Mar. 20, 1990 [JP] Japan ................. 2-68022

[51] Int. Cl.$^5$ ................. H01L 29/60; H01L 21/28
[52] U.S. Cl. ................. 437/41; 437/203; 437/228; 437/912
[58] Field of Search ................. 437/41, 228, 912, 39, 437/175, 40, 39, 80, 228; 357/15; 156/643

[56] References Cited

U.S. PATENT DOCUMENTS

| | | | |
|---|---|---|---|
| 4,729,967 | 3/1988 | Armiento | 437/40 |
| 4,774,206 | 9/1988 | Willer | 437/41 |

FOREIGN PATENT DOCUMENTS

| | | | |
|---|---|---|---|
| 0064745 | 11/1982 | European Pat. Off. | 437/40 |
| 57-72384 | 5/1982 | Japan . | |
| 58-178569 | 10/1983 | Japan | 437/39 |
| 59-195824 | 11/1984 | Japan | 437/80 |
| 61-154079 | 7/1986 | Japan . | |
| 0079677 | 4/1987 | Japan | 437/40 |
| 0115782 | 5/1987 | Japan | 437/40 |
| 62-186568 | 8/1987 | Japan . | |
| 0056959 | 3/1988 | Japan | 437/40 |
| 63-77163 | 4/1988 | Japan . | |
| 63-90171 | 4/1988 | Japan | 437/40 |
| 63-138780 | 6/1988 | Japan . | |
| 63-181477 | 7/1988 | Japan . | |
| 0228671 | 9/1988 | Japan | 437/40 |

Primary Examiner—Olik Chaudhuri
Assistant Examiner—Richard Booth
Attorney, Agent, or Firm—Nikaido, Marmelstein, Murray & Oram

[57] ABSTRACT

A method of producing a semiconductor device (MESFET) which includes the following steps (a) to (h): (a) forming a trapezium dummy gate, which is made of a first insulating material ($SiO_2$) and has two normal slopes, on a semiconductor substrate (of a compound semiconductor); (b) selectively forming ohmic electrodes, coming in contact with the dummy gate, on the semiconductor substrate; (c) forming an element isolation region in the semiconductor substrate; (d) forming an insulating film of a second insulating material ($Si_3N_4$), different from the first insulating material, over the entire surface; (e) selectively removing projected portions of the dummy gate and insulating film to make a flat portion composed of the remaining dummy gate and insulating film; (f) removing the dummy gate to form an opening having two reverse slopes; (g) forming a sidewall portion of a third insulating material ($SiO_2$), which is different from the second insulating material, on the reverse slopes of the opening to form a gate opening corresponding to a narrower gate length; and (h) forming a gate electrode to thereby fill the gate opening.

8 Claims, 6 Drawing Sheets

METHOD OF PRODUCING SEMICONDUCTOR DEVICE USING DUMMY GATE STRUCTURE

BACKGROUND OF THE INVENTION

1. Field of the Invention

Present invention relates to a semiconductor device, more specifically, to a method of producing a metal-semiconductor field-effect transistor (MESFET).

Preferably, the present invention is applied to a MESFET of a compound semiconductor, e.g., a III-V compound, such as GaAs and InP.

In semiconductor devices such as ICs and LSIs, a miniaturization of the devices is required in order to raise the speed and enhance the performance thereof, as well as to reduce the area of each transistor to thereby increase the integrality thereof. To satisfy these requirements, it is necessary to develop a lithography technique and a self-alignment process by which a pattern having submicron dimensions can be formed.

Furthermore, when a gate length which is directly connected to the characteristics of an FET is shortened, in compliance with the need for miniaturization, the gate resistance ($R_G$) is usually increased, and therefore, it is necessary to form a gate electrode into a shape such that the resistance is lowered, e.g., by making a sectional area of the gate electrode larger.

2. Description of the Related Art

In a conventional method of producing a MESFET, an active region is defined (element-isolated) by an ion-implantation or a mesa-etching, and thereafter, (1) ohmic electrodes (a source electrode and a drain electrode) are formed to match the active regon, and then a gate electrode is formed to match the ohmic electrodes; or (2) a heat-resistant gate electrode is formed on a portion of the active region, ohmic regions are then self-aligningly formed by an ion-implantation, and thereafter, the ohmic electrodes are formed to match the active region. Nevertheless, since the active region, the ohmic electrodes, and the gate electrode are independently formed in predetermined patterns, a positional deviation of the patterns is liable to occur, and to prevent this defect it is necessary to allow a sufficient clearance for the positioning. Furthermore, the gate length substantially depends upon the lithography technique used, and it is difficult to control the gate length after the lithography step has been carried out. Therefore, to lower the gate resistance, it is necessary to form another larger pattern metal layer on the gate electrode. Further, where the active region is defined (i.e., the isolation region is formed) by the ion-implantation method, the distinction of an implanted region pattern is difficult, and therefore, it is necessary to previously form a suitable matching pattern (alignment pattern) to smooth the process in the subsequent steps.

Heretofore, in the production of a MESFET having a submicron size gate, five or more mask steps are involved in the formation of all of the electrodes of the MESFET and often a positioning (alignment) deviation occurs in the respective steps, and thus it is difficult to control the device characteristics of the MESFET. further, since the gate length of the MESFET substantially depends upon the lithography technique used, a gate length having a size smaller than the gate pattern size of the mask cannot be obtained.

SUMMARY OF THE INVENTION

An object of the present invention is to provide a method of producing a semiconductor device (MESFET) which permits a reduction of the number of lithography mask steps, and a shortening of the gate length, by using a technique other than the lithography technique.

An object of the present invention is to provide a production method which enables a miniaturization of the semiconductor device (LSI and IC) and an improvement of the semiconductor device and individual MESFETs thereof.

The above-mentioned and other objects of the present invention can be achieved by a method of producing a semiconductor device, which comprises the following steps (a) to (h): (a) forming a trapezium dummy gate, made of a first insulating material and having two normal slopes, on a semiconductor substrate; (b) selectively forming ohmic electrodes, coming into contact with the dummy date, on the semiconductor substrate; (c) forming an element isolation region in the semiconductor substrate; (d) forming an insulating film, of a second insulating material different from the first insulating material, over the whole surface; (e) selectively removing projecting portions of the dummy gate and insulating film to obtain a flat portion of the remaining dummy gate and insulating film; (f) removing the dummy gate to form an opening having two reverse slopes; (g) forming a sidewall portion of a third insulating material, which is different from the second insulating material, on the reverse slopes of the opening, to form a gate opening; and (h) forming a gate electrode that fills the gate opening.

In the present invention, a trapezium dummy gate is used to define a spacing (distance) between ohmic electrodes (a source electrode and a drain electrode). Namely, an insulating film is formed on the dummy gate and the ohmic electrodes, whereafter the dummy gate projects from the insulating film portion on the ohmic electrodes. The projecting portion of the dummy gate and the insulating film portion thereon are removed, to bring the remaining dummy gate to the level of the insulating film portion on the ohmic electrodes (i.e., to form a flat surface composed of the remaining dummy gate and the insulating film portion). Thereafter, the remaining dummy gate is removed to form an opening for a gate electrode, which opening has a reverse trapezium shape with an upper side shorter than a bottom side thereof and has two reverse slopes corresponding to the normal slopes (equal leg sides) of the trapezium dummy gate, and a sidewall insulating film portion is selectively formed on the reverse slopes of the opening by a self-alignment system, to thereby form a gate opening. As a result, a narrower gate length corresponding to the gate opening width can be obtained than that obtained by a lithography system. The gate length depends upon the width of the dummy gate and the thickness of the sidewall portion, and this thickness can be controlled by a formation thickness of the insulating film including the sidewall portion and an etched amount of the film. The patterning of the ohmic electrodes and the patterning of the gate electrode are not connected to the gate portion which comes in contact with the semiconductor substrate, and therefore, a deviation of the masks has less influence on the device characteristics of a MESFET. Only three mask steps are used, i.e., the two patterning mask steps and one patterning mask step for the dummy gate, and thus it can be said that the method of the present invention is a self-alignment system utilizing the dummy gate.

BRIEF DESCRIPTION OF THE DRAWINGS

The present invention will be more apparent from the description of the preferred embodiments set forth below, with reference to the accompanying drawings, in which.

EXAMPLE 1

FIGS. 1A to 1J show schematic sections of a semiconductor device, for illustrating a process for the production of a MESFET in accordance with the present invention where an element isolation (region) for defining an active region is formed by the utilization of an ion-implantation method.

Figure 1A:
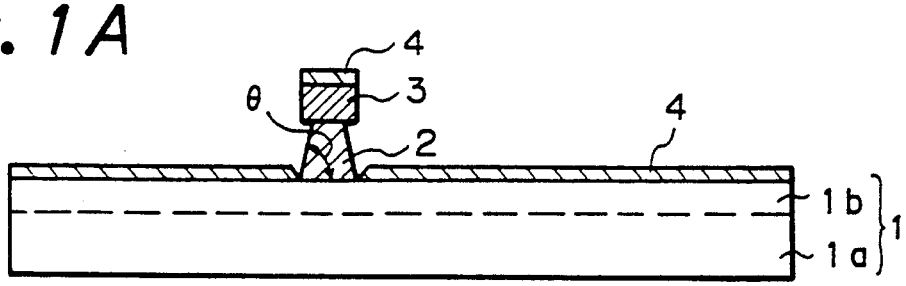
FIGS. 1A to 1J are schematic sectional views of a MESFET in various stages of the production thereof in accordance with a first embodiment of the present invention.

First, as shown in FIG. 1A, a semiconductor substrate 1 is constituted of a semi-insulating compound semiconductor substrate (e.g., semi-insulating GaAs wafer) 1a and an n-type compound semiconductor (e.g., GaAs) layer 1b epitaxially grown thereon. As the compound semiconductor, a III-V compound semiconductor such as InP and InGap may be used, and as the semiconductor substrate, an SOI (silicon on insulator) substrate can be used. For example, the semiconductor substrate consists of an InP substrate and three epitaxial layers (i.e., an InGaAs layer, an InAlAS layer and an InGaAs layer).

A first insulating material (e.g., $SiO_2$) for a dummy gate is deposited over the entire surface of the semiconductor substrate 1 by a CVD method or a sputtering method to form an insulating ($SiO_2$) layer having a thickness of e.g., 600 nm. Thereafter, in accordance with conventional lithography method, a resist is deposited on the insulating layer and a light exposure is then carried out through a first photomask having a dummy gate pattern, followed by developing, to form a first resist layer 3 on the insulating ($SiO_2$) layer. The insulating ($SiO_2$) layer is selectively etched by an isotropic etching method using the above-mentioned resist layer 3 as a mask, whereby a dummy gate 2 is formed as shown in FIG. 1A. The obtained dummy gate 2 has a trapezium section with equal leg sides and has two normal slopes having an oblique angle $\theta$ of from 75 to 60 degrees, preferably about 70 degrees. For example, the dummy gate 2 has an upper width of 0.6 $\mu$m and a bottom width of 1.0 $\mu$m. The insulating ($SiO_2$) layer is selectively wet-etched by using an etching solution of ammonium fluorid and hydrofluoric acid (10:1) to obtain the oblique angle of about 70 degrees. On the other hand, the layer is selectively dry-etched by using a plasma of an $NF_3$ gas to form the oblique angle of about 70 degrees. Next, an ohmic metal film (AuGe/Au) having a thickness of e.g., 300 nm 4 is deposited on the entire surface.

The resist layer 3 is then removed, and accordingly, the metal film portion on the resist layer 3 is also removed, in a lift-off manner.

Figure 1B:
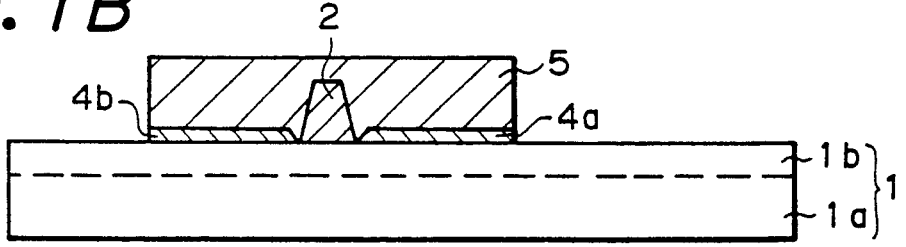

As shown in FIG. 1B, in accordance with a conventional lithography method, another resist is deposited on the entire surface and a light exposure is then carried out through a second photomask having an ohmic electrode pattern, followed by developing, to form a second resist layer 5 on the dummy gate 2 and the ohmic metal film 4.

Thereafter, the ohmic metal film 4 is selectively etched by an etching method using the resist layer 5 as a mask, to form ohmic electrodes 4a and 4b having pre-determined patterns.

Figure 1C:
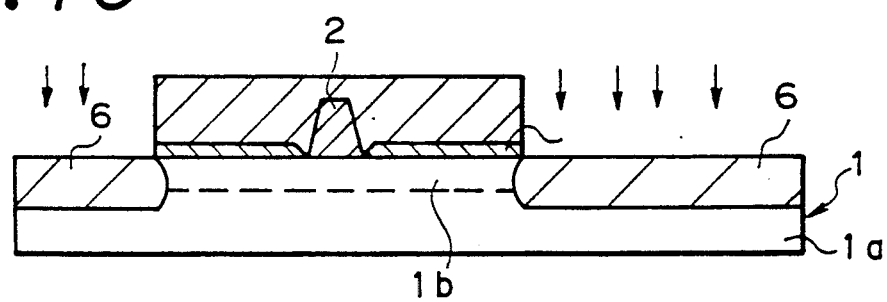

Next, as shown in FIG. 1C, the remaining resist layer 5 is used as a mask, and ions of oxygen ($O_2$) or hydrogen ($H_2$) are injected into the substrate 1 from the surface of the epitaxial layer 1b, until they reach the semi-insulating substrate 1a, by an ion-implantation method, whereby an insulating (isolation) region 6 is formed. Thus, an active region is defined under the ohmic electrodes 4a, 4b and the dummy gate 2, to achieve, an element isolation.

Figure 1D:
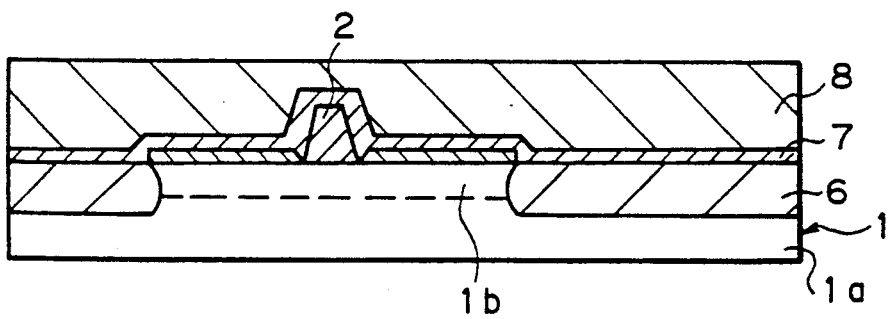

After the removal of the resist layer 5, a second insulating material ($Si_3N_4$) which is different from the first insulating material ($SiO_2$) of the dummy gate 2 is deposited on the entire surface to form an insulating film 7 having a thickness of, e.g., 200 nm, as shown in FIG. 1D. Furthermore, a resist layer 8 is formed on the film 7 by a coating method.

Figure 1E:
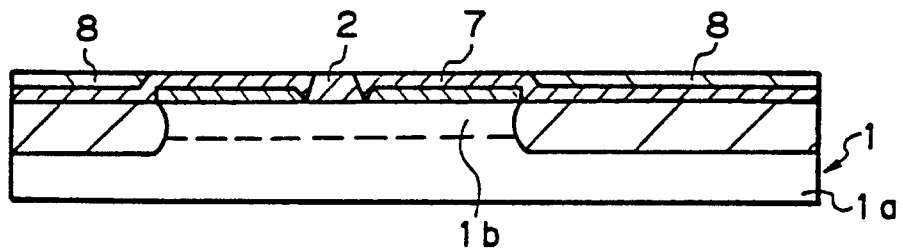

The resist layer 8, a part of the dummy gate 2, and the insulating film thereon are uniformly etched by an overall etching method such as an argon (Ar) milling method, and this etching is stopped when the surface of the insulating film 7 on the ohmic electrodes 4a, 4b is exposed, as shown in FIG. 1E. The projecting portion of the dummy gate 2 is removed to thereby form a flat surface together with the exposed portion of the insulating film 7. The remaining resist layer 8 is then removed.

Figure 1F:
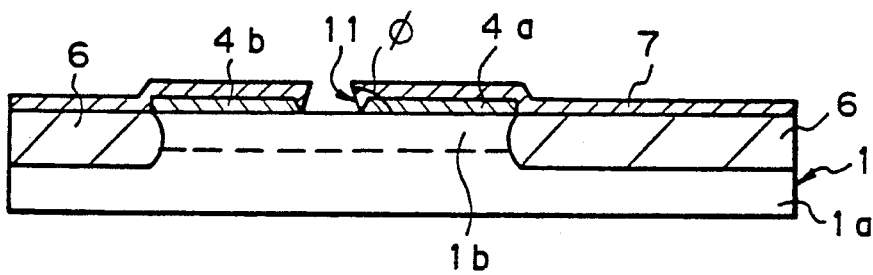

Next, as shown in FIG. 1F, the remaining dummy gate 2 only is etched to form an opening 11, with the result that the surface of the semiconductor substrate 1 is partially exposed in the opening. Since the section of the dummy gate 2 is a trapezium, the opening 11 has a reverse trapezium sectional shape with an upper side longer than a bottom side and has two reverse slopes (i.e., supplementary angle $\phi$).

Figure 1G:
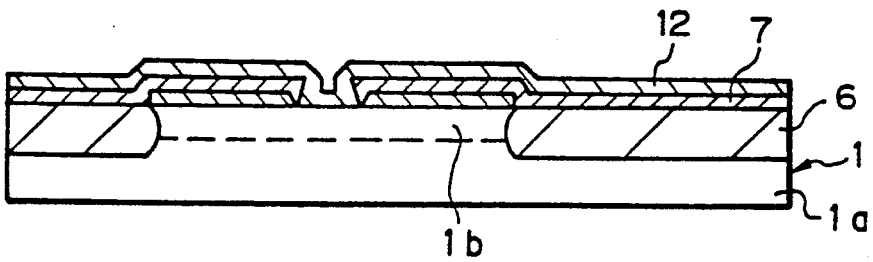

A third insulating material ($SiO_2$), which is different from the second insulating material ($Si_3N_4$) of the insulating film 7, is deposited on the entire surface, including the interior of the opening 11, by the CVD method as shown in FIG. 1G, to thereby form an insulating layer 12 having a thickness of, e.g., 300 nm.

Figure 1H:
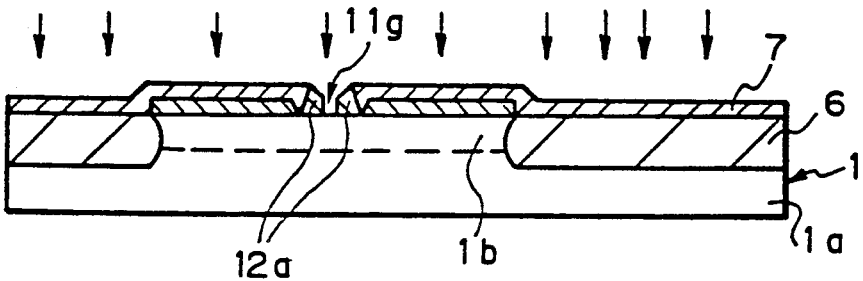

The insulating ($SiO_2$) layer 12 is then etched by an anisotropic dry etching method until the surface of the substrate 1 is exposed in the opening, as shown in FIG. 1H, and as a result, the surface of the insulating ($Si_3N_4$) film 7 is exposed and sidewall portions (i.e., residue) 12a of the insulating ($SiO_2$) layer 12 remain on the reverse slopes of the opening 11 to form an gate opening 11g. The partial surface of the semiconductor substrate 1 surrounded by the sidewall portion 12a is exposed in the gate opening 11g, and the width of this exposed surface corresponds to a gate length. The above-mentioned anisotropic dry etching is preferably a reactive ion etching (RIE), but may be an Ar milling. The larger the oblique angle of the dummy gate (i.e., of the opening 11), the larger both overhang portions of the insulating film 7 (see FIG. 1F), whereby a thickness of the sidewall portions 12a at the bottom thereof can be increased. Namely, the gate length is additionally controlled by the oblique angle in addition to the gate length control by the bottom width of the dummy gate.

If the production of a recess type MESFET is intended, the exposed portion of the epitaxial grown layer 1b of the semiconductor substrate 1 within the gate opening 11g can be etched to form a recess having a predetermined depth.

Figure 1I:
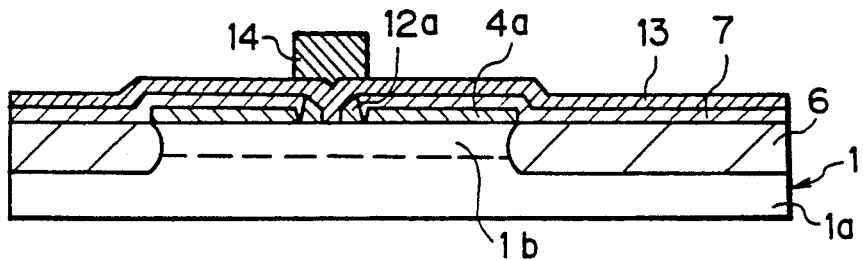

Next, as shown in FIG. 1I, a gate metal (e.g., Al) is deposited on the entire surface, to fill the gate opening, by a vacuum deposition method, to form a metal film 13 having a thickness of, e.g., 400 nm. In accordance with a conventional lithography method, a resist is deposited, and a light exposure is then carried out through a third photomask having a gate electrode pattern, followed by developing, to form a third resist layer 14.

Figure 1J:
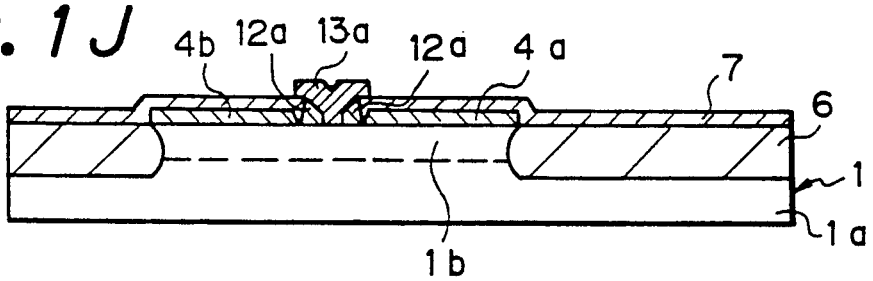

Finally, as whom in FIG. 1J, the metal film 13 is selectively etched by a suitable etching method, using the third resist layer 14 as a mask, to form a gate electrode 13a having a predetermined pattern. This gate electrode 13a has a T-shaped form as seen in section, which prevents an increase in the gate resistance due to the miniaturization. According to the above-mentioned procedure, the gate length is defined by the self-alignment system of the dummy gate, and the active region and the isolation region are defined by the self-alignment system of the ohmic electrodes, to thereby produce the MESFET.

EXAMPLE 2

FIG. 2A to 2J are schematic sections for explaining the production process of a MESFET in accordance with the present invention where an element isolation (region) for defining an active region is formed by the utilization of a mesa etching method. The same procedure as in Example 1 is effected except that the element isolation method is different, and the same reference numbers as in Example 1 are used.

Figure 2A:
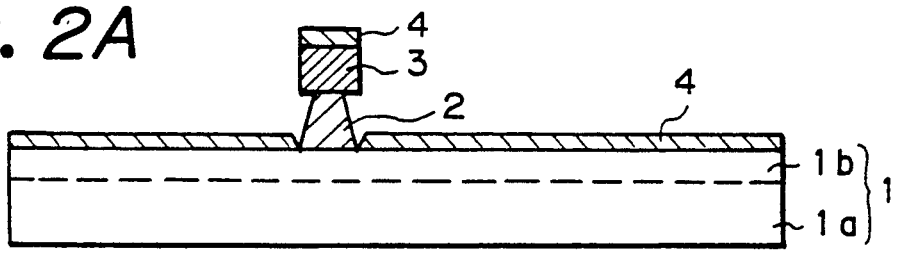
FIGS. 2A to 2J are schematic sectional views of a MESFET in various stages of the production thereof in accordance with a second embodiment of the present invention.
Figure 2B:
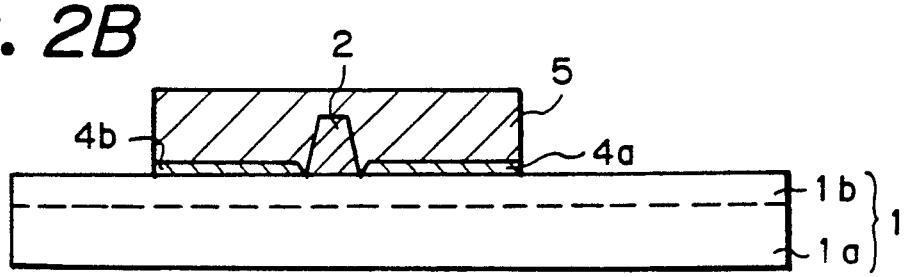

FIG. 2A and 2B correspond to FIGS. 1A and 1B mentioned above, and a dummy gate 2 and ohmic electrodes 4a, 4b are formed on a semiconductor substrate 1 comprising a semi-insulating compound semiconductor substrate 1a and an epitaxial (active) layer 1b.

Figure 2C:
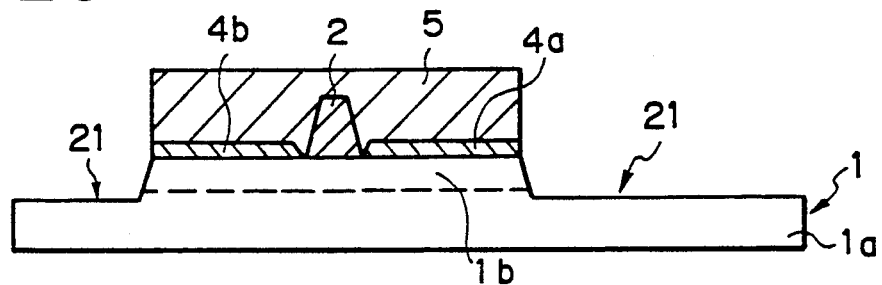

As shown in FIG. 2C, a resist layer 5 is retained and used as a mask, and the semiconductor substrate 1 is etched until the semi-insulating substrate 1a is exposed, to form an element isolation region (space) 21. A remaining portion of the epitaxial layer 1b under the dummy gate 2 and the ohmic electrodes 4a, 4b is the mesa type active region, and thus is isolated from another active region.

Figure 2D:
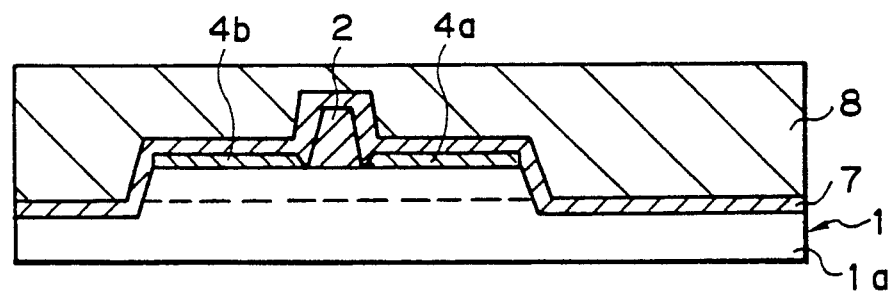
Figure 2E:
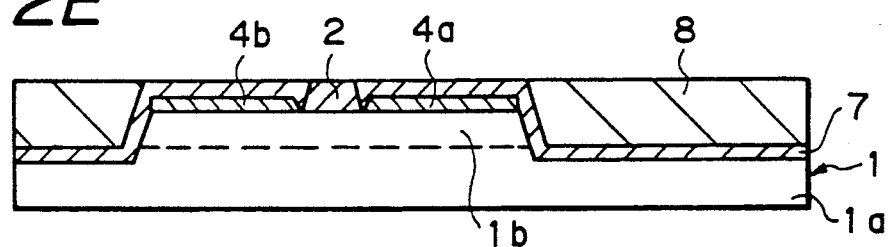

After the removal of the resist layer 5, as shown in FIG. 2D, an insulating ($Si_3N_4$) film 7 is formed over the entire surface, and a resist layer 8 then formed thereon by a coating method.

As shown in 2E, the resist layer 8, the dummy gate 2 and the insulating film portion thereon are uniformly etched by an overall etching method such as argon (Ar) milling. When the surface of the insulating film 7 on the ohmic electrodes 4a, 4b is exposed, the etching is stopped, to flatten the surface together with the insulating film 7 as shown in FIG. 1E. The remaining resist layer 8 is then removed.

Figure 2F:
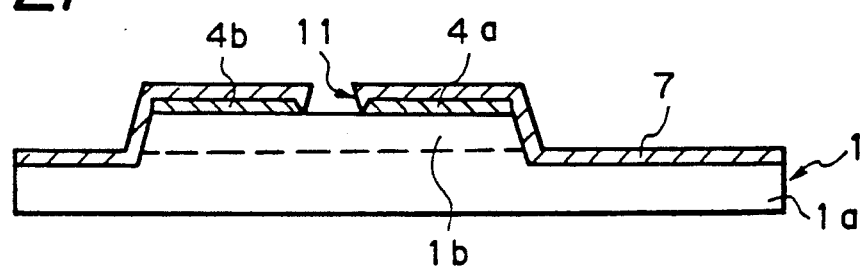

Next, as shown in FIG. 2F, the dummy gate 2 only is removed by etching to form a opening 11 having a reverse trapezium sectional shape with an upper side longer than a bottom side and having two reverse slopes, so that the surface of the semiconductor substrate 1 is partially exposed in the opening.

Figure 2G:
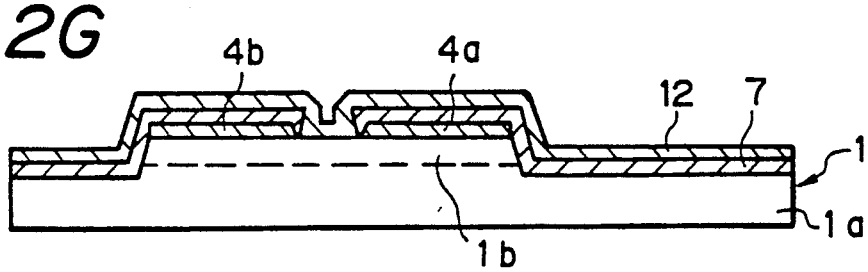

A third insulating material ($SiO_2$), which is different from the second insulating material ($Si_3N_4$) of the insulating film 7, is deposited thereover, including the interior of the opening 11 by the CVD method as shown in FIG. 2G, to thereby form an insulating layer 12.

Figure 2H:
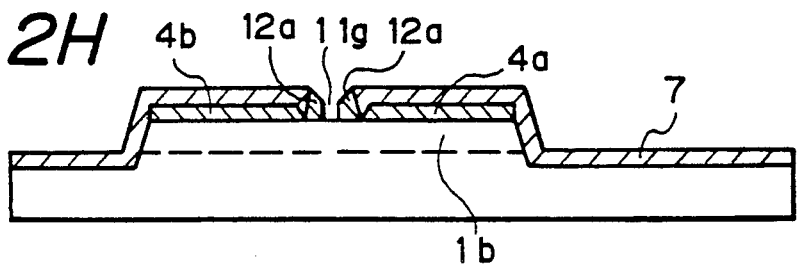

The insulating ($SiO_2$) layer 12 is then etched by an anisotropic dry etching method until the surface of the substrate 1 is exposed in the opening 11, as shown in FIG. 2H, and as a result, the surface of the insulating ($Si_3N_4$) film 7 is exposed and asidewall portion 12a of the insulating ($SiO_2$) layer 12 is formed on the reverse slopes of the opening 11 to form a gate opening 11g. The partial surface of the semiconductor substrate 1 surrounded by the sidewall portion 12a is exposed in the gate opening 11g, and the width of this exposed surface corresponds to a gate length, similar to that shown in FIG. 1H.

Figure 2I:
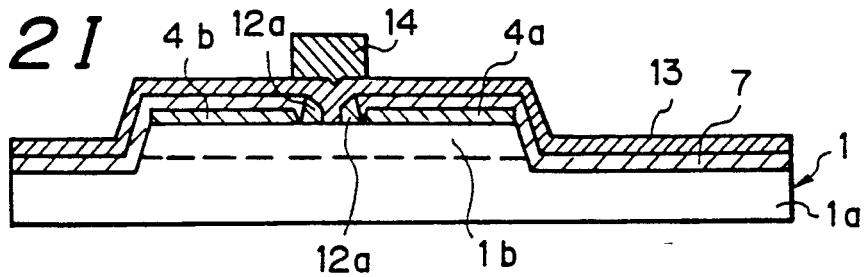

Next, as shown in FIG. 2I, a gate metal (Al) is deposited on the entire surface, to fill the gate opening 11g by a vacuum deposition method, and thereby form a metal film 13. Thereafter, in accordance with a conventional lithography method, a resist is deposited and a light exposure is then carried out through a third photomask having a gate electrode pattern, followed by developing, to form a third resist layer 14.

Figure 2J:
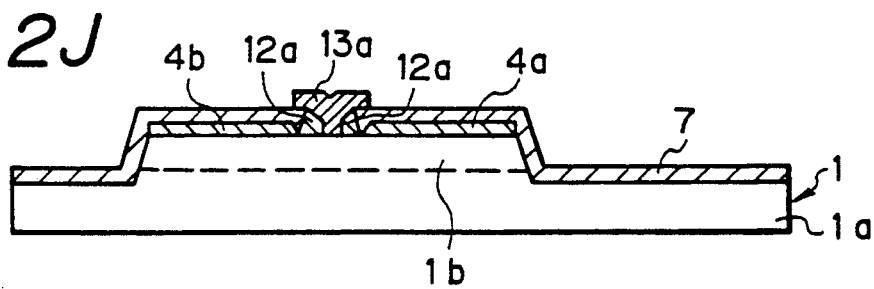

Finally, as shown in FIG. 2J, the metal film 13 is selectively etched by a suitable etching method using the third resist layer 14 as a mask, to form a gate electrode 13a having a predetermined pattern. According to the above-mentioned procedure, in a manner similar to that of Example 1, the gate length can be defined by the self-alignment system of the dummy gate, and the active region and the isolation region can be defined by the self-alignment system of the ohmic electrodes, to thereby produce the MESFET.

As described above, according to the present invention, individual elements (MESFETs) of a semiconductor device are formed in a self-alignment manner, and the number of masks to be used (i.e., the number of lithography mask steps) can be reduced, and elements having a submicron size gate can be obtained in spite of the use of relatively large mask patterns (e.g., where an used mask has a dummy gate pattern having a width of 1 $\mu$m, the thickness of the sidewall portions is adjusted to 400 nm, whereby a gate length of 0.2 $\mu$m can be obtained). After a size definition due to a lithography process, the thickness of the sidewall portion can be controlled to further regulate the gate length, which can contribute to an improvement of the performance and dimensional controllability of the individual MESFET and the IC thereof.

Figure 3:
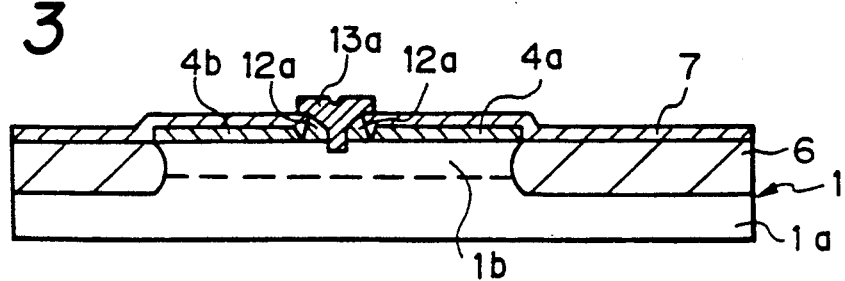
FIG. 3 is a schematic sectional view of a recess type MESFET.

It will be obvious that the present invention is not restricted to the above-mentioned embodiments and that many variations are possible for persons skilled in the art without departing from the scope of the invention. For example, a recess gate type FET shown in FIG. 3 can be produced by adding a step of etching the exposed portion of the semiconductor substrate in the gate opening, to form a recess therein, after the step (g) of formation of the gate opening (FIG. 1H) and before the step (h) of formation of the gate electrode.

Figure 4A:
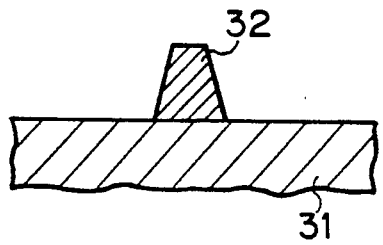
FIG. 4A to 4G are schematic sectional views of a semiconductor device in various stages of the production thereof in accordance with the present invention.
Figure 4B:
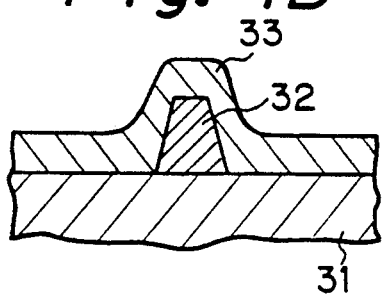
Figure 4C:
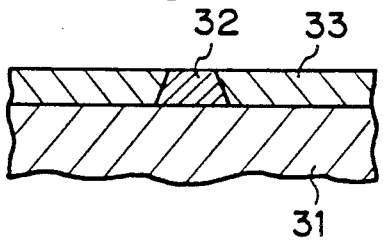
Figure 4D:
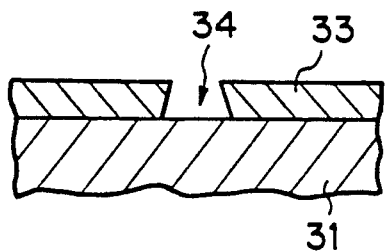
Figure 4E:
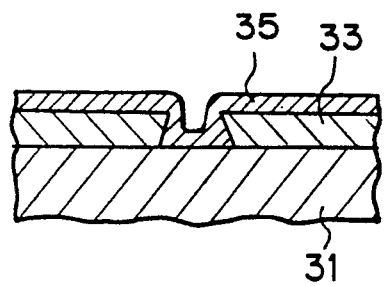
Figure 4F:
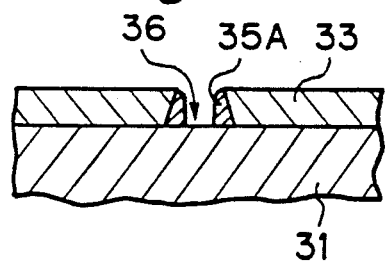
Figure 4G:
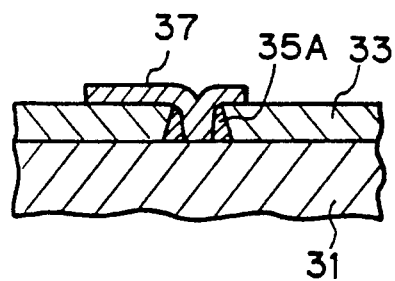

Furthermore, it is possible to apply the present invention on formation of a fine contact hole and an interconnection layer of a semiconductor device, as shown in FIGS. 4A to 4G. In this case, the semiconductor device includes a bipolar transistor, an metal-insulator-semiconductor (MIS) FET as well as the MESFET which are produced by using silicon or compound semiconductor. For example, as shown in FIG. 4A, an insulating material (e.g., $Si_3N_4$) for a dummy contact-hole portion is deposited over the entire surface of a (lower) metal layer (or a silicon single crystalline substrate) 31. A resist mask (not shown) having a contact-hole shape is formed on the insulating layer. The insulating layer is selectively and isotopicaly etched to form a dummy contact-hole portion 32 which has a trapezium section and has two normal slopes with an oblique angle of about 70 degrees. After a removal of the resist mask, as shown in FIG. 4B, a second insulating material ($SiO_2$) is deposited on the entire surface to form an insulating layer 33 is formed to cover the dummy contact-hole portion 32. Another resist layer (not shown) is formed on insulating layer 33. Then, as shown in FIG. 4C, the resist layer and an upper part of the dummy contact-hole portion 32 are uniformly etched by an overall etching method (e.g., an argon milling method), and this etching is stopped when a flat portion of the insulating layer 33 appears, with the result that the exposed surfaces of the dummy contact-hole portion 32 and insulating layer 33 form a flat surface. The remaining dummy contact-hole portion 32 only is removed by a suitable etching, as shown in FIG. 4D, to form an opening (preformed contact hole) 34 having a reverse trapezium sectional shape and having two reverse slopes. Next, as shown in FIG. 4E, a third insulating ($SiO_2$) layer 35 is formed on the entire surface, including the interior of the opening 34. The insulating layer 35 is anisotropicaly etched by a suitable dry etching, so as to leave sidewall portions (residue) 35A on the reverse slopes of the opening 34 to form a predetermined contact hole 36, as shown in FIG. 4F. Therefore, the size of the contact hole 36 is defined (controlled) with the dimensions of the dummy contact portion 32 and the thickness of the sidewall portions 35A. Thus, it is possible to make the contact hole 36 finer. Next, as shown in FIG. 4G, an interconnection (metal) layer 37 is formed in the contact hole 36 and on the insulating layer 33 in accordance with a conventional process.

I claim:

1. A method of producing a semiconductor device, which comprises the following steps:

forming a trapezium dummy gate, which includes a first insulating material and which has two side slopes each having an oblique angle of less than 90°, on a semiconductor substrate;

forming a metal layer for ohmic contact electrodes on said semiconductor substrate and on a mask layer which is formed on said dummy gate;

removing said mask layer and a portion of said metal layer on said mask layer and selectively removing said metal layer to form said ohmic electrodes coming in contact with said dummy gate, on said semiconductor substrate;

forming an insulating film of a second insulating material different from said first insulating material, over the entire surface;

selectively removing projected portions of said dummy gate and insulating film to make a flat portion composed of the remaining dummy gate and insulating film;

removing said dummy gate to form an opening having two side slopes each having a supplementary angle to a respective side slope of said trapezium dummy gate;

forming a sidewall portion of a third insulating material on the side slopes of said opening to form a gate opening; and forming a gate electrode to therein fill said gate opening.

2. A method according to claim 1, wherein said oblique angle is from 75 to 60 degrees.

3. A method according to claim 1, wherein said semiconductor substrate consists of a semi-insulating compound semiconductor substrate and a compound semiconductor active layer epitaxially grown thereon.

4. A method according to claim 1, wherein said semiconductor device is a metal-semiconductor field-effect transistor.

5. A method according to claim 1, wherein said sidewall portion formation step comprises a step of forming a film of said third insulating material on a whole surface including said opening, and then a step of anisotropically etching said third insulating material film, to leave said sidewall portion only.

6. A method of producing a semiconductor device, which comprises the following steps:

(a) forming a trapezium dummy gate, which includes a first insulating material and which has two side slopes each having an oblique angle of less than 90°, on a semiconductor substrate;

(b) selectively forming ohmic electrodes coming in contact with said dummy gate, on said semiconductor substrate;

(c) forming an element isolation region in said semiconductor substrate;

(d) forming an insulating film of a second insulating material different from said first insulating material, over the entire surface;

(e) selectively removing projected portions of said dummy gate and insulating film to make a flat portion composed of the remaining dummy gate and insulating film;

(f) removing said dummy gate to form an opening having two side slopes each having a supplementary angle to a respective side slope of said trapezium dummy gate;

(g) forming a sidewall portion of a third insulating material on the side slopes of said opening to form a gate opening; and (h) forming a gate electrode to therein fill said gate opening.

7. A method according to claim 6, wherein said element isolation region is formed by an ion-implantation process.

8. A method according to claim 6, wherein said element isolation region is formed by selectively etching said semiconductor substrate not covered with said dummy gate and ohmic electrodes.

* * * * *